United States Patent
Li et al.

(10) Patent No.: US 11,398,410 B2
(45) Date of Patent: Jul. 26, 2022

(54) METHOD FOR MANUFACTURING A CMOS DEVICE

(71) Applicant: SHANGHAI HUALI INTEGRATED CIRCUIT CORPORATION, Shanghai (CN)

(72) Inventors: Runling Li, Shanghai (CN); Xuefei Chen, Shanghai (CN)

(73) Assignee: SHANGHAI HUALI INTEGRATED CIRCUIT CORPORATION, Shanghai (CN)

(*) Notice: Subject to any disclaimer, the term of this patent is extended or adjusted under 35 U.S.C. 154(b) by 0 days.

(21) Appl. No.: 16/857,076

(22) Filed: Apr. 23, 2020

(65) Prior Publication Data
US 2021/0143066 A1   May 13, 2021

(30) Foreign Application Priority Data

Nov. 13, 2019 (CN) .......................... 201911107530.5

(51) Int. Cl.
*H01L 21/8238* (2006.01)
*H01L 21/02* (2006.01)
*H01L 21/265* (2006.01)

(52) U.S. Cl.
CPC .. *H01L 21/823814* (2013.01); *H01L 21/0217* (2013.01); *H01L 21/0228* (2013.01); *H01L 21/26513* (2013.01); *H01L 21/823864* (2013.01); *H01L 21/823878* (2013.01)

(58) Field of Classification Search
None
See application file for complete search history.

(56) References Cited

U.S. PATENT DOCUMENTS

| 2006/0046201 | A1 | 3/2006 | Sandhu et al. |
| 2012/0003806 | A1* | 1/2012 | Wang .................. H01L 29/7833 |
| | | | 438/305 |
| 2016/0064516 | A1 | 3/2016 | Lee et al. |
| 2017/0170074 | A1* | 6/2017 | Liu ................. H01L 21/823814 |
| 2019/0027357 | A1* | 1/2019 | Girard ................... C23C 16/345 |
| 2019/0051565 | A1* | 2/2019 | Baars .............. H01L 21/823418 |

FOREIGN PATENT DOCUMENTS

| CN | 1846313 A | 10/2006 |
| CN | 101930949 A | 12/2010 |
| CN | 102610516 A | 7/2012 |
| CN | 103367364 A | 10/2013 |
| CN | 103531453 A | 1/2014 |
| CN | 104616979 A | 5/2015 |
| CN | 105789275 A | 7/2016 |
| CN | 108122825 A | 6/2018 |
| KR | 2006-0077013 A | 7/2006 |

OTHER PUBLICATIONS

1st China Search Report for China Application No. 2019-111075305 dated Sep. 7, 2021 (3 pages).

* cited by examiner

*Primary Examiner* — Asok K Sarkar
(74) *Attorney, Agent, or Firm* — Alston & Bird LLP

(57) ABSTRACT

A method for manufacturing a CMOS device includes: forming a gate structure and gate sidewalls of the CMOS device, wherein the material of the gate sidewalls is silicon nitride; depositing a silicon nitride film directly on the gate structure and the gate sidewalls, wherein the depositing is performed via atomic layer deposition (ALD); and performing a photolithography process to define an ion implantation region.

6 Claims, 5 Drawing Sheets

METHOD FOR MANUFACTURING A CMOS DEVICE

CROSS-REFERENCES TO RELATED APPLICATIONS

This application claims the priority to Chinese patent application No. CN201911107530.5 filed at CNIPA on Nov. 13, 2019, and entitled "METHOD FOR MANUFACTURING A CMOS DEVICE", the disclosure of which is incorporated herein by reference in entirety.

TECHNICAL FIELD

The present disclosure relates to the field of semiconductor manufacturing, in particular to a method for manufacturing a CMOS device.

BACKGROUND

In mainstream integrated circuit (IC) manufacturing process, the sidewalls of a gate usually contains silicon nitride. However, photoresists applied in dozens of photolithography processes in making ICs are sensitive to nitrogen-containing materials. Thus, silicon nitride materials easily cause photoresist denaturation which generates an undesirable footing phenomenon. In order to solve the footing phenomenon, an oxygen plasma is often applied for interface treatment before any photolithography process currently.

However, at the 45/40 nm and below technology nodes, due to light reflection from the gate active region and the shallow trench isolation region, the current interface treatment performed by oxygen plasma is prone to creating the problem of photoresist undercut at the bottom of the photoresist patterns. Thus, resultant pattern distortions affect regions defined by a number of ion implantation processes, such as lightly doped drain (LDD), halogen ion implantation, and source/drain (S/D) ion implantation, thereby impacting device performance.

BRIEF SUMMARY

According to some embodiments in this application, a method for manufacturing a CMOS device is disclosed in the following steps: forming a gate structure and gate sidewalls of the CMOS device, wherein the material of the gate sidewalls is silicon nitride; depositing a silicon nitride film directly on the gate structure and the gate sidewalls, wherein the depositing is performed via atomic layer deposition (ALD); and performing a photolithography process to define an ion implantation region.

In some examples, the thickness of the silicon nitride film is 10 to 50 Å.

In some examples, the reaction temperature during depositing the silicon nitride film is 300° C. to 700° C.

In some examples, before forming the gate structure and the gate sidewalls, further comprising: forming a shallow trench isolation on the substrate, the shallow trench isolation being used to define an active region.

In some examples, a plurality of PMOS devices and/or a plurality of NMOS devices are fabricated on the substrate.

In some examples, after performing a photolithography process to define an ion implantation region, the method further comprising: performing an ion implantation process.

In some examples, the material of the silicon nitride film is pure silicon nitride or carbon-doped silicon nitride or boron-doped silicon nitride.

Figure 1:
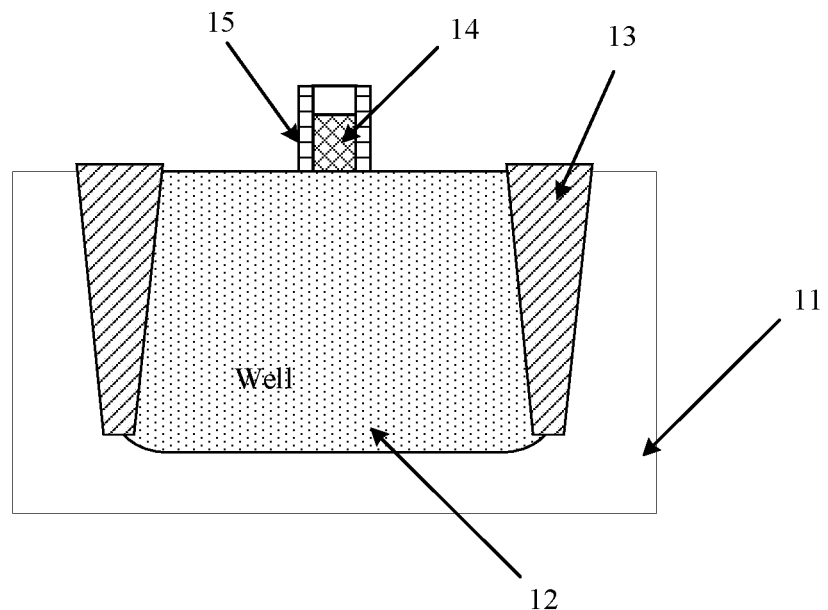
FIG. 1 is a schematic diagram of a semiconductor device with a gate structure and gate sidewalls.

Reference numbers in the drawings are listed in the following: 11: substrate, 12: well implantation region; 13: shallow trench isolation; 14: gate structure; 15: gate sidewalls; 16: photoresist; 17: photoresist undercut; 18: ALD silicon nitride film.

DETAILED DESCRIPTION OF THE DISCLOSURE

The technical solutions in this application will be clearly and completely described below with reference to the drawings. Obviously, the described embodiments are part of the embodiments of the application, instead of all them. Based on the embodiments in the present application, all other embodiments obtained by one skilled in the art without contributing any inventive labor shall fall into the protection scope of the present application.

In the description of this application, it should be noted that the orientation or positional relationship indicated by the terms "center", "upper", "lower", "left", "right", "vertical", "horizontal", "inside", "outside", or the like is based on the orientation or positional relationship shown in the drawings, is only for the convenience of describing this application and simplified description, and does not indicate or imply that the indicated device or element must have a specific orientation or be configured and operated in a specific orientation. Therefore, the orientation or positional relationship should not to be construed as limitations on the present application. In addition, the terms "first," "second," and "third" are used for descriptive purposes only, and should not be construed to indicate or imply relative importance.

In the description of this application, it should be noted that the terms "installation", "connected", and "connection" should be understood in a broad sense, unless explicitly stated and defined otherwise, for example, they may be fixed connection or removable connection, or integral connection; can be mechanical or electrical connection; can be direct connection, or indirect connection through an intermediate medium, or the internal communication of two elements, and can be wireless or wired connection. For those of ordinary skill in the art, the specific meanings of the above terms in this application can be understood in specific situations.

In addition, the technical features involved in the different implementations of the present application described below can be combined with each other as long as they do not conflict with each other.

FIG. 1 illustrates a schematic diagram of a semiconductor device with a gate structure and gate sidewalls. In the process for manufacturing a CMOS device, gate 14 and gate sidewalls 15 are formed on a substrate 11, referring to FIG. 1.

Figure 2:
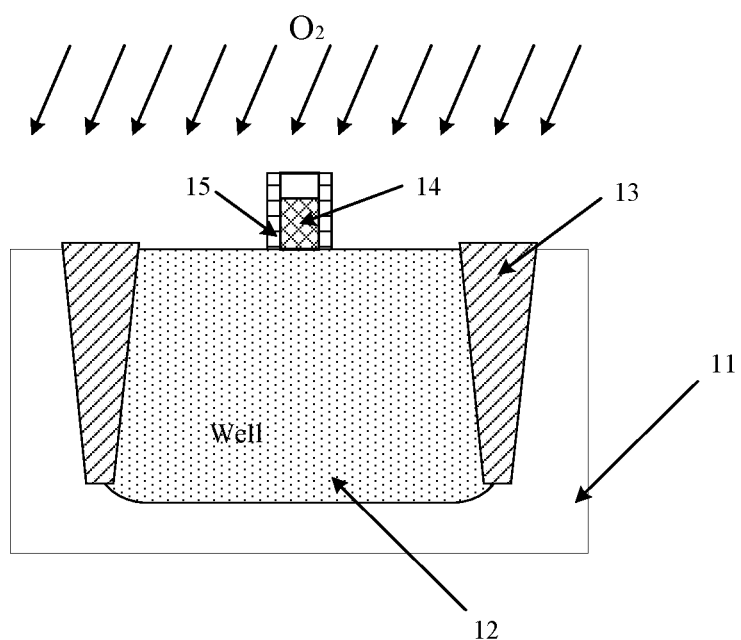
FIG. 2 shows the oxygen plasma treating an interface of the gate sidewalls in FIG. 1.

FIG. 2 illustrates the current interface treatment process via oxygen plasma before performing a photolithography process.

The material of the gate side walls 15 is silicon nitride. Since the photoresist in the photolithography process is sensitive to nitrogen-containing materials, the gate side walls 15 are likely to cause photoresist degeneration, thereby generating the pattern footing phenomenon. Therefore, in the existing process, before the photolithography process, oxygen plasma is usually used for interface treatment, referring to FIG. 2.

Figure 3:
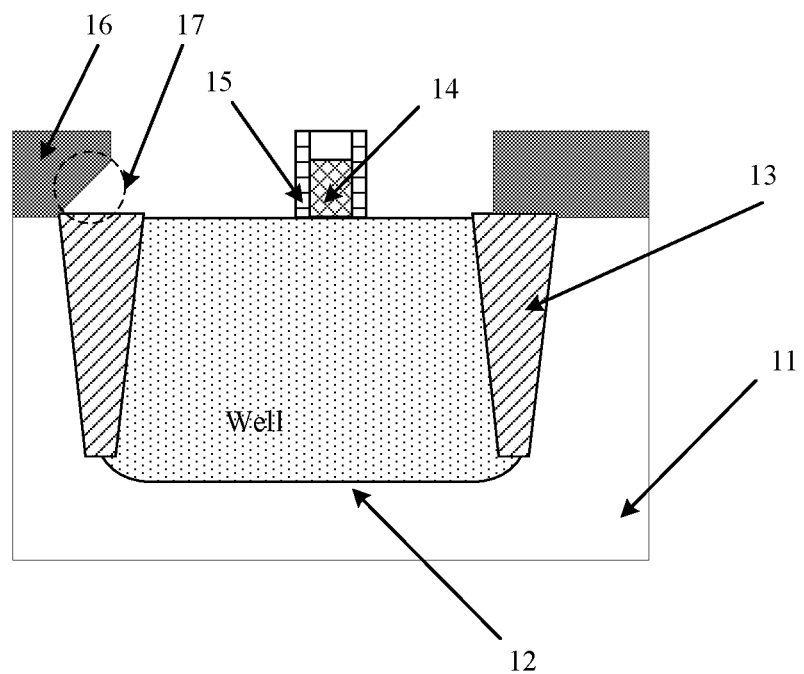
FIG. 3 shows the photoresist undercut generated after a photolithography process after oxygen plasma treatment of FIG. 2.

FIG. 3 illustrates the photoresist undercut generated after a photolithography process.

At 40 nm and below technology nodes, due to the light reflection from the active region and the shallow trench isolation region, the interface treatment performed with oxygen plasma can easily cause photoresist undercut 17 at the bottom of the photoresist pattern 16, referring to FIG. 3. The undercut further leads to distortion of many ion implantated patterns.

Figure 4:
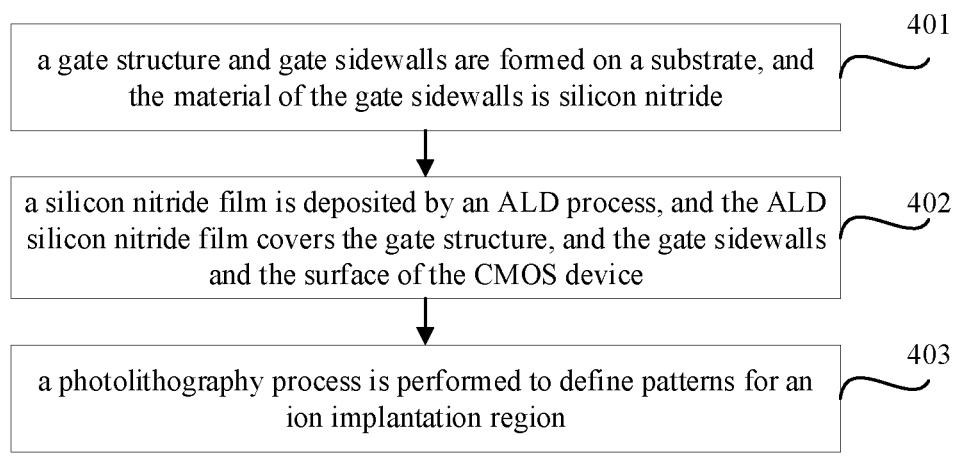
FIG. 4 is a flowchart of the method for manufacturing a CMOS device, according to one embodiment of the present application.

In order to solve this photoresist undercut problem at the active region and the shallow trench isolation regions, one embodiment of the present application provides a method for manufacturing a CMOS device, including the following steps illustrated in FIG. 4.

In step 401, a gate structure and gate sidewalls are formed on a substrate, and the material of the gate sidewalls is silicon nitride.

Referring to FIG. 1, the substrate 11 includes well implantation region 12 and shallow trench isolation 13. A gate structure 14 and gate sidewalls 15 are formed on the surface of the substrate 11.

In step 402, a silicon nitride film is deposited by an ALD process, and the ALD silicon nitride film covers the gate structure, and the gate sidewalls and the surface of the CMOS device.

The atomic layer deposition technology is used to deposit the silicon nitride film, often the film will be called ALD film.

Figure 5:
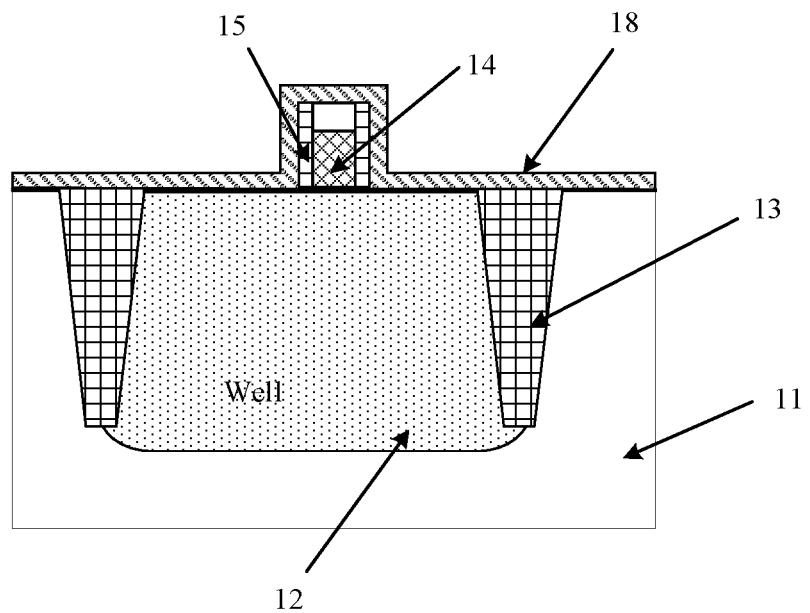
FIG. 5 shows the device cross sectional view after an ALD film is deposited on the device, according to one embodiment of the present application.

FIG. 5 illustrates the cross sectional view of the device after the ALD film is deposited, according to one embodiment of the present application.

Referring to FIG. 5, an ALD silicon nitride film 18 is deposited, and the ALD silicon nitride film 18 covers the surface of the device on substrate 11, the gate structure 14 and the gate sidewalls 15.

In step 403, a photolithography process is performed to define patterns for an ion implantation region.

According to the area of the ion implantation, a photolithography process before the ion implantation is performed to define the patterns for an ion implantation region on the surface of the substrate.

The very thin ALD silicon nitride film has higher saturated chemical bonds at the film surface, it released a smaller amount of nitrogen atoms compared to thicker nitride films.

Following the spin-coated photoresist coated on the substrate, the photoresist reacts with the nitrogen atoms released from the ALD silicon nitride film, resulting in an appropriate poisoning (deactivating) of the photoresist on the surface of the silicon nitride film. Thus, the reflected light from the device does not overexpose the bottom of the photoresist pattern, thereby preventing the undercut footing. Therefore, the problem of the photoresist undercut is much reduced, and the distortion of the ion implantation patterns is successfully avoided.

Figure 6:
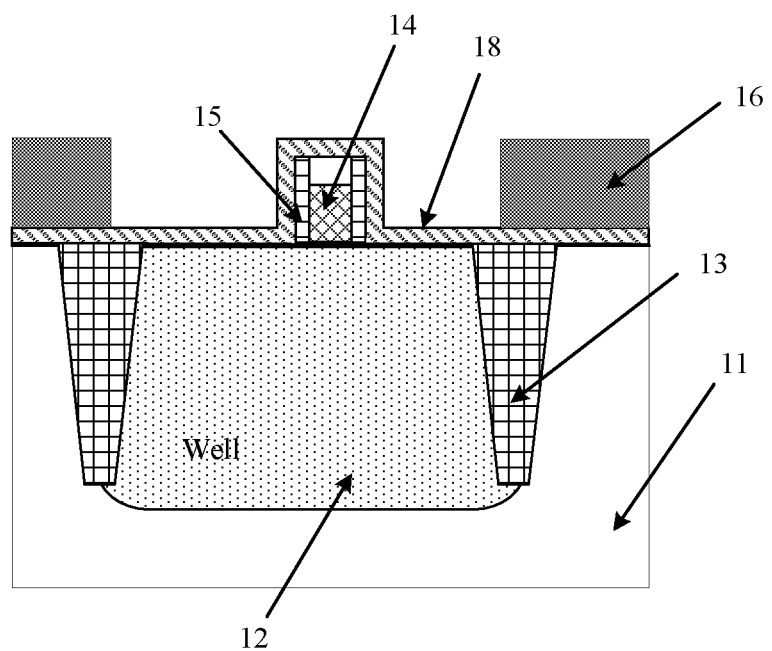
FIG. 6 is the device cross section with the ALD film after the photolithography process, according to one embodiment of the present application.

FIG. 6 illustrates the cross sectional views of the much improved device after the photolithography process, according to one embodiment of the present application.

Referring to FIG. 6, there is no photoresist undercut at the bottom of the photoresist 16 after the photolithography process is performed, according to the embodiment of the current disclosure.

In summary, by depositing a silicon nitride film through an ALD process on the gate structure and the silicon nitride gate sidewalls on the device, prior to patterning a photoresist layer, the pattern footing undercut problem in the later ion implantation process has been overcome.

The benefit of this technique includes avoiding the appearance of footing and photoresist undercut, therefore ensuring the pattern accuracy of the ion implantation regions.

Figure 7:
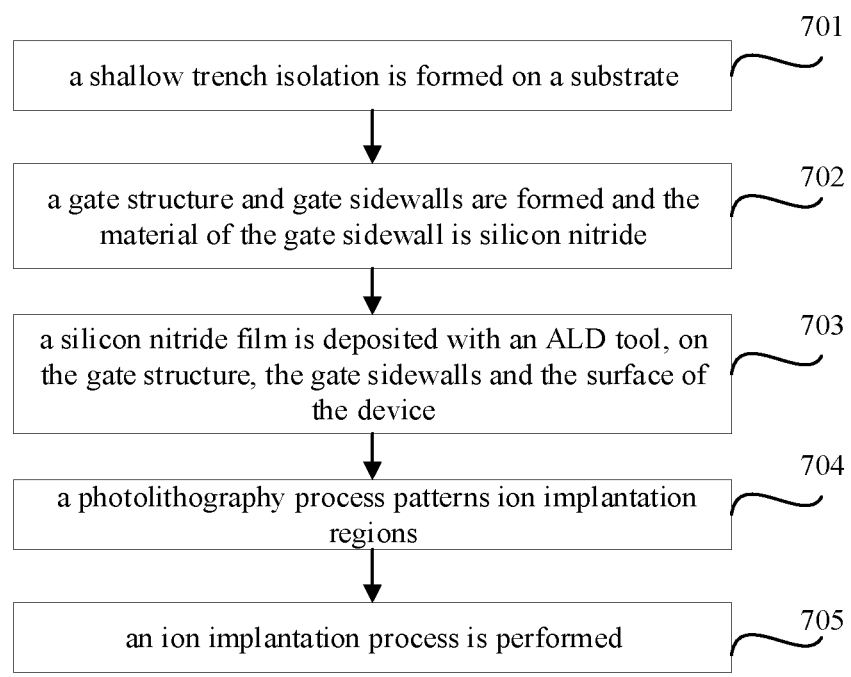
FIG. 7 is a flowchart of another method for manufacturing a CMOS device, according to another embodiment of the present application.

FIG. 7 is a flowchart of another method for manufacturing a CMOS device, according to another embodiment of the present disclosure.

In step 701, a shallow trench isolation is formed on a substrate.

The shallow trench isolation defines active device regions for PMOS devices and/or NMOS devices.

In step 702, a gate structure and gate sidewalls are formed and the material of the gate sidewall is silicon nitride.

In step 703, a silicon nitride film is deposited with an ALD tool, on the gate structure, the gate sidewalls and the surface of the device.

In some examples, the thickness of the ALD silicon nitride film is 10 to 200 Å.

In some examples, the reaction temperature during the ALD deposition of the silicon nitride film is 300° C. to 700° C.

In some examples, the material of the ALD silicon nitride film is pure silicon nitride, carbon-doped silicon nitride, or boron-doped silicon nitride.

In step 704, a photolithography process patterns ion implantation regions.

It should be noted that, the interface treatment via the use of oxygen plasma can no longer needed before the lithography process, because the silicon nitride film has been deposited via ALD to protect the resist footing.

In step 705, an ion implantation process is performed.

During the ion implantation process, the ALD deposited silicon nitride film stays on. In a CMOS manufacturing process, there would be a plurality of photolithography processes and ion implantation processes. This silicon nitride film may be shared by other similar processes and function in other photolithography processes to avoid similar footing and photoresist undercut phenomena.

It should be noted that steps 704 to 705 may be repeatedly performed after step 703, and the number of repeated executions is determined according to actual conditions, which is not defined in the embodiments of the present application.

In summary, the embodiments of the present disclosure solve the problem of photoresist undercut after the silicon nitride sidewalls are formed, and avoid footing and ensure accurate patterns of the ion implantation regions by forming the shallow trench isolation, the gate structure, and the silicon nitride gate sidewalls, ALD depositing the silicon nitride film, to the gate structure, silicon nitride gate sidewalls and necessary device surface. This improvement is done without increasing lots of cost and complexity of the process.

It should be noted that this technique is most applied to but not limited to logic 40 nm and below technology nodes.

In one example, after the silicon nitride gate sidewalls of the PMOS device is formed, a silicon nitride film is deposited by ALD, without involving the oxygen plasma process for interface treatment, and a photolithography process is directly performed on the SiN film. No photoresist undercut and the pattern distortion occur.

In another example, after the silicon nitride gate sidewalls of the NMOS device are formed, a silicon nitride film is deposited by an ALD tool, without oxygen plasma performing interface treatment, and a lithography process to define ion implantation areas is directly performed. As a result, no photoresist undercut and the pattern distortion problem occur.

In still another example, after forming the heavily doped silicon nitride gate sidewalls of the NMOS/PMOS devices, a silicon nitride film is deposited on the gate sidewalls by an ALD tool, the lithography process defining ion implantation is directly performed to avoid pattern distortion from top film reflection.

Obviously, the foregoing embodiments are merely for clear description of made examples, and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

What is claimed is:

1. A method for manufacturing a CMOS device, comprising:
    forming an active region for the CMOS device on a substrate;
    forming shallow trench isolations on the substrate, wherein two of the shallow trench isolations defines an active region of the CMOS device;
    forming a gate structure in the active region of the CMOS device;
    forming a gate sidewalls layer on both sides of the gate structure, wherein a material of the gate sidewalls layer is silicon nitride, and wherein the gate sidewalls layer does not extend to a surface of the shallow trench isolations;
    depositing a silicon nitride film directly on the gate structure, the gate sidewalls, a surface of the active region, and the surface the shallow trench isolations, wherein the depositing is performed via atomic layer deposition (ALD);
    depositing a photoresist layer on the silicon nitride film, and patterning the photoresist layer above a portion of the surface of the shallow trench isolation, and patterning the photoresist layer in a photolithography process; and
    performing ion implantation over the silicon nitride film to form source/drain for the gate structure, wherein during the implantation process, the silicon nitride film remains on the surface of the substrate between the patterned photoresist layer above the shallow trench isolation and one of the sidewalls of the gate structure closer to said shallow trench isolation, and wherein the silicon nitride film protects a footing of the photoresist layer during patterning to define an ion implantation region for source/drain.

2. The method for manufacturing a CMOS device, according to claim 1, wherein the thickness of the silicon nitride film is 10 to 50 Å.

3. The method for manufacturing a CMOS device, according to claim 1, wherein the reaction temperature during depositing the silicon nitride film is 300° C. to 700° C.

4. The method for manufacturing a CMOS device, according to claim 1, wherein a plurality of PMOS devices and/or a plurality of NMOS devices are fabricated on the substrate.

5. The method for manufacturing a CMOS device, according to claim 1, wherein the material of the silicon nitride film is pure silicon nitride or carbon-doped silicon nitride or boron-doped silicon nitride.

6. The method for manufacturing a CMOS device, according to claim 1, wherein the method is applied to the 40 nm and below technology nodes.

* * * * *